US012067471B2

(12) United States Patent
Gao et al.

(10) Patent No.: US 12,067,471 B2
(45) Date of Patent: Aug. 20, 2024

(54) SEARCHING AN AUTONOMOUS VEHICLE SENSOR DATA REPOSITORY BASED ON CONTEXT EMBEDDING

(71) Applicant: Waymo LLC, Mountain View, CA (US)

(72) Inventors: Jiyang Gao, San Jose, CA (US); Zijian Guo, Sunnyvale, CA (US); Congcong Li, Cupertino, CA (US); Xiaowei Li, Los Altos, CA (US)

(73) Assignee: Waymo LLC, Mountain View, CA (US)

( * ) Notice: Subject to any disclaimer, the term of this patent is extended or adjusted under 35 U.S.C. 154(b) by 897 days.

(21) Appl. No.: 17/104,921

(22) Filed: Nov. 25, 2020

(65) Prior Publication Data

US 2022/0164350 A1 May 26, 2022

(51) Int. Cl.
*G06F 16/24* (2019.01)
*B60W 60/00* (2020.01)
(Continued)

(52) U.S. Cl.
CPC ............ *G06N 3/02* (2013.01); *B60W 60/0027* (2020.02); *G06F 30/27* (2020.01); *G06N 3/08* (2013.01);
(Continued)

(58) Field of Classification Search
CPC ... G06F 16/538; G06F 16/535; G06N 3/0427; G06N 3/0454; G06N 3/08; G05D 1/0088; G05D 1/0221; G05D 2201/0213
See application file for complete search history.

(56) References Cited

U.S. PATENT DOCUMENTS 10,111,043 B1* 10/2018 Cirit .................... H04W 4/023
2011/0242342 A1* 10/2011 Goma .................. H04N 23/665
348/E5.024

(Continued)

OTHER PUBLICATIONS

Hallac et al., "Drive2Vec: Multiscale State-Space Embedding of Vehicular Sensor Data", Dec. 10, 2018, IEEE (Year: 2018).*

(Continued)

*Primary Examiner* — Hosain T Alam
*Assistant Examiner* — Robert F May
(74) *Attorney, Agent, or Firm* — Fish & Richardson P.C.

(57) ABSTRACT

Methods, systems, and apparatus, including computer programs encoded on computer storage media, for searching an autonomous vehicle sensor data repository. One of the methods includes maintaining a collection of sensor samples and one or more embeddings of each sensor sample. Each sensor sample is generated from sensor data at multiple time steps and characterizes an environment at each of the multiple time steps. Each embedding corresponds to a respective portion of the sensor sample and has been generated by an embedding neural network. A query specifying a query portion of a query sensor sample is received. A query embedding corresponding to the query portion of the query sensor sample is generated through the embedding neural network. A plurality of relevant sensor samples that have embeddings that are closest to the query embedding are identified as characterizing similar scenarios to the query portion of the query sensor sample.

20 Claims, 3 Drawing Sheets

(51) Int. Cl.
*G06F 30/27* (2020.01)
*G06N 3/02* (2006.01)
*G06N 3/08* (2023.01)
*G06V 20/56* (2022.01)
*G08G 1/01* (2006.01)

(52) U.S. Cl.
CPC ........... *G06V 20/56* (2022.01); *G08G 1/0104* (2013.01); *B60W 2554/4045* (2020.02); *B60W 2554/4046* (2020.02)

(56) References Cited

U.S. PATENT DOCUMENTS

| | | | |
|---|---|---|---|
| 2018/0012082 A1* | 1/2018 | Satazoda | G06V 10/763 |
| 2019/0129436 A1* | 5/2019 | Sun | G06N 20/00 |
| 2019/0156134 A1* | 5/2019 | Krishnan | G06V 20/59 |
| 2019/0266266 A1* | 8/2019 | Mishra | G06F 16/24578 |
| 2020/0176121 A1* | 6/2020 | Dalal | G16H 20/60 |

OTHER PUBLICATIONS

Hwang et al., "Fast kNN classification algorithm based on partial distance search," Electronics letters, 1998, 34(21):2062-2063.

\* cited by examiner

SEARCHING AN AUTONOMOUS VEHICLE SENSOR DATA REPOSITORY BASED ON CONTEXT EMBEDDING

BACKGROUND

This specification relates to autonomous vehicles.

Autonomous vehicles include self-driving cars, boats, and aircraft. Autonomous vehicles use a variety of on-board sensors and computer systems to detect nearby objects and use such detections to make control and navigation decisions.

Some autonomous vehicles have on-board computer systems that implement neural networks, other types of machine learning models, or both for various prediction tasks, e.g., object classification within images. For example, a neural network can be used to determine that an image captured by an on-board camera is likely to be an image of a nearby car. Neural networks, or for brevity, networks, are machine learning models that employ multiple layers of operations to predict one or more outputs from one or more inputs. Neural networks typically include one or more hidden layers situated between an input layer and an output layer. The output of each layer is used as input to another layer in the network, e.g., the next hidden layer or the output layer.

Each layer of a neural network specifies one or more transformation operations to be performed on input to the layer. Some neural network layers have operations that are referred to as neurons. Each neuron receives one or more inputs and generates an output that is received by another neural network layer. Often, each neuron receives inputs from other neurons, and each neuron provides an output to one or more other neurons.

An architecture of a neural network specifies what layers are included in the network and their properties, as well as how the neurons of each layer of the network are connected. In other words, the architecture specifies which layers provide their output as input to which other layers and how the output is provided.

The transformation operations of each layer are performed by computers having installed software modules that implement the transformation operations. Thus, a layer being described as performing operations means that the computers implementing the transformation operations of the layer perform the operations.

Each layer generates one or more outputs using the current values of a set of parameters for the layer. Training the neural network thus involves continually performing a forward pass on the input, computing gradient values, and updating the current values for the set of parameters for each layer using the computed gradient values. Once a neural network is trained, the final set of parameter values can be used to make predictions in a production system.

SUMMARY

This specification describes how a computer system can use context embeddings to effectively search a repository of sensor data collected from autonomous vehicles.

An embedding, as used in this specification, is a numeric representation of a group of sensor data that characterizes an environment region. In particular, an embedding is a numeric representation in an embedding space, i.e., an ordered collection of a fixed number of numeric values, where the number of numeric values is equal to the dimensionality of the embedding space. For example, the embedding can be a vector of floating point or other type of numeric values. Generally, the dimensionality of the embedding space is much smaller than the number of numeric values in the group of sensor data represented by a given embedding.

In general, one innovative aspect of the subject matter described in this specification can be embodied in methods that include the actions of maintaining a collection of sensor samples and, for each sensor sample, one or more embeddings of the sensor sample, wherein: each sensor sample in the collection is generated from sensor data captured by a corresponding vehicle at multiple time steps and characterizes an environment in a vicinity of the corresponding vehicle at each of the multiple time steps, and each embedding corresponds to a respective portion of the sensor sample and has been generated by processing data from the corresponding sensor sample through an embedding neural network that has been trained to process data from input sensor samples to generate a respective embedding for each input sensor sample; receiving a query specifying a query portion of a query sensor sample, wherein the query sensor sample is generated from sensor data captured at multiple query time steps; and identifying, from the collection of sensor samples, a plurality of relevant sensor samples that characterize similar scenarios to the query portion of the query sensor sample, including: processing data from the query sensor sample through the embedding neural network to generate a query embedding corresponding to the query portion of the query sensor sample; and identifying, from sensor samples in a subset of the sensor samples in the collection, the plurality of relevant sensor samples that have embeddings that are closest to the query embedding. Other embodiments of this aspect include corresponding computer systems, apparatus, and computer programs recorded on one or more computer storage devices, each configured to perform the actions of the methods. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

The foregoing and other embodiments can each optionally include one or more of the following features, alone or in combination. In particular, one embodiment includes all the following features in combination. The portion of the sensor sample includes a region within the sensor sample, and the actions include: generating a global embedding of the sensor sample by processing the data from the sensor sample; and generating an embedding that corresponds to the region within the sensor sample by cropping the global embedding according to the region within the sensor sample. The global embedding is generated from one or more layers of a spatio-temporal embedding neural network that is configured to generate a spatio-temporal embedding that represents spatial and temporal features of the environment characterized by the sensor sample. The query portion of the query sensor sample includes a query region in the query sensor sample, and identifying the plurality of relevant sensor samples that characterize similar scenarios to the query portion of the query sensor sample includes: identifying a region within each of the plurality of relevant sensor samples that has a similar spatio-temporal embedding to the query region in the query sensor sample. The portion of the sensor sample includes a perception object corresponding to an object in the environment, and the actions includes processing the portion of the sensor sample corresponding to the perception object to generate an embedding of the perception object. The perception object corresponds to a vehicle in the environment, and the embedding of the perception object is generated from one or more layers of a vehicle intent neural network that is configured to predict an intent of the vehicle. The query portion of the query sensor sample includes a query perception object corresponding to a query vehicle detected in the query sensor sample, and identifying the plurality of relevant sensor samples that characterize similar scenarios to the query portion of the query sensor sample includes: identifying a vehicle within each of the plurality of relevant sensor samples that has a similar intent to the query vehicle detected in the query sensor sample. The actions further include generating a visual representation for each of the plurality of relevant sensor samples; and providing the visual representations for presentation on a user device. The actions further include using the relevant sensor samples to generate training data for a machine learning model. The embeddings of the sensor samples in the collection and the query embedding are each generated in accordance with trained values of parameters of the embedding neural network. The plurality of relevant sensor samples that have embeddings that are closest to the query embedding are the sensor samples that are nearest to the query embedding according to a distance metric. The distance metric is Euclidean distance or cosine similarity.

Particular embodiments of the subject matter described in this specification can be implemented to realize one or more of the following advantages.

Autonomous or semi-autonomous vehicles have sensors that collect data about the environment surrounding the vehicle as the vehicle drives through the environment. The data collected by these sensors over many driving hours and by many different autonomous vehicles can be stored in a repository for later use, e.g., for playback to users that analyze events encountered by vehicles driving through an environment, or for use in training machine learning models to make various predictions that may be relevant to the operation of the autonomous vehicle. For example, stored data can be used to train a machine learning model that classifies objects of a particular type.

The data collected by these sensors and stored in the repository can capture events or scenarios. The events or scenarios can involve relationships between multiple objects. Examples of scenarios of interest can include double-parked cars, passengers loading or unloading a vehicle, and cars yielding or cutting in front of other cars, etc. Finding interesting events or scenarios from the repository can be critical in many autonomous driving applications. For example, the system can use the identified interesting events or scenarios to train machine learning models such that the machine learning models are robust to such events or scenarios. The system can use the trained machine learning models in the on-board system of an autonomous vehicle to ensure that the vehicle can navigate through the environment accurately and safely when encountering the events or scenarios.

However, searching the repository for scenarios that are similar to a query scenario of interest can be challenging. First, a scenario of interest can include complex relationships between multiple objects. For example, a scenario of a group of walking pedestrians can include location relationships between the pedestrians in the group. Second, a scenario of interest can include information of the context, i.e., an environment surrounding the multiple objects, and its interaction with the multiple objects. For example, a scenario of double-parked cars, e.g., two cars parked parallel with each other, can include the location information of a curb or sidewalk, and its relative distance from each of the two cars. Third, a scenario of interest can involve sensor measurements over multiple time steps. For example, a scenario of a vehicle that cuts in front of an autonomous vehicle can involve multiple frames of camera images that capture the "cut in" action over a period of time, e.g., 3 seconds.

The described techniques allow the system to effectively search the sensor data repository based on a context embedding. The context embedding is learned from machine learning methods to characterize and index different types of events or scenarios. A context embedding can characterize complex relationships between multiple objects, as well as the behaviors of the objects and their contexts over a period of time. The system can perform searching based on the similarity between a query scenario in a query sensor data and the scenarios in the sensor data stored in the repository by using context embeddings. In particular, the system can measure the similarity through computing distances between a context embedding of the query scenario and context embeddings of scenarios in the sensor data. Thus, the system can effectively identify similarities between scenes or events characterized by a large amount of high-dimensional sensor data by searching through relatively lower-dimensional context embedding of the sensor data.

The system can use different types of context embeddings to capture different scenarios. In some implementations, the system can generate a context embedding from raw sensor data from multiple frames without performing object recognition or classification. For example, the context embeddings can include a spatio-temporal embedding that captures spatial and temporal relationship between multiple objects over a period of time. Given an example scene of double-parked cars, the system can use the spatio-temporal embedding over multiple frames of sensor data to search for other double-parked cars in the repository. In some implementations, the system can first detect an object of interest in the scene, and then can generate a context embedding from a portion of the sensor data that is near the object of interest. For example, the context embedding can include a vehicle intent embedding that captures an intent of a vehicle interacting with the environment, e.g., a vehicle that is changing its lane.

Unlike single object centric methods or rule-based methods, the described context embedding based searching technique is generic, extensible and scalable. Rather than relying on accurate object recognition of a particular type of object, the described searching technique is generic and extensible because it is based on an embedding of a scenario between multiple objects. Rather than relying on a rule-based method that requires different rules for different scenarios, the described technique is generic, extensible and scalable for different scenarios. Furthermore, the described technique can characterize some real-world scenarios that cannot be easily described by any rules.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This specification describes how a training system can use context embeddings to effectively search a sensor data repository.

Figure 1:
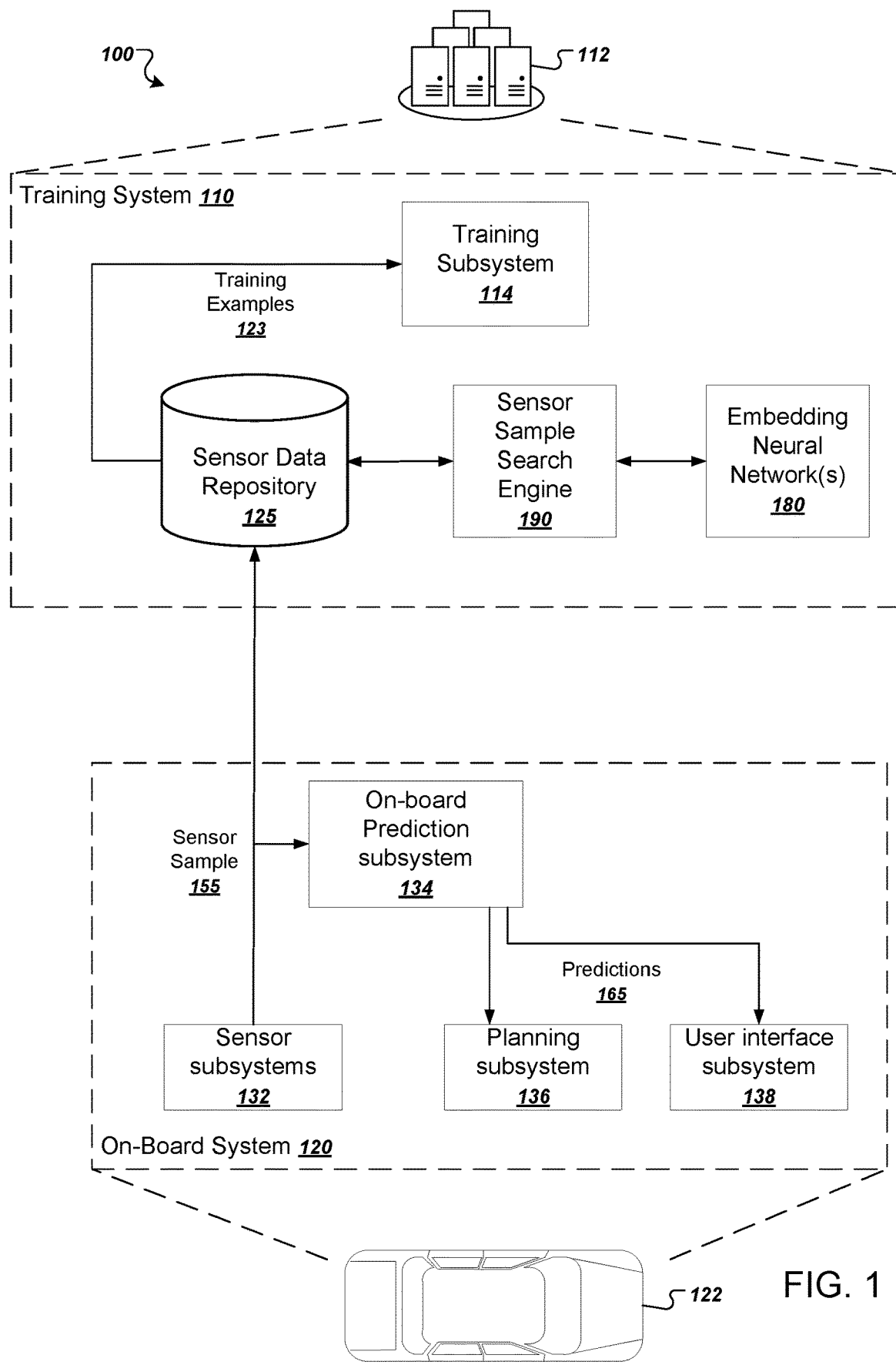
FIG. 1 is a diagram of an example system.

FIG. 1 is a diagram of an example system 100. The system 100 includes a training system 110 and an on-board system 120.

The on-board system 120 is physically located on-board a vehicle 122. The vehicle 122 in FIG. 1 is illustrated as an automobile, but the on-board system 120 can be located on-board any appropriate vehicle type. The vehicle 122 can be a fully autonomous vehicle that determines and executes fully-autonomous driving decisions in order to navigate through an environment. The vehicle 122 can also be a semi-autonomous vehicle that uses predictions to aid a human driver. For example, the vehicle 122 can autonomously apply the brakes if a prediction indicates that a human driver is about to collide with another vehicle.

The on-board system 120 includes one or more sensor subsystems 132. The sensor subsystems 132 include a combination of components that receive reflections of electromagnetic radiation, e.g., lidar systems that detect reflections of laser light, radar systems that detect reflections of radio waves, and camera systems that detect reflections of visible light.

The raw sensor measurement generated by a given sensor generally indicates a distance, a direction, and an intensity of reflected radiation. For example, a sensor can transmit one or more pulses of electromagnetic radiation in a particular direction and can measure the intensity of any reflections, as well as the time that the reflection was received. A distance can be computed by determining how long it took between a pulse and its corresponding reflection. The sensor can continually sweep a particular space in angle, azimuth, or both. Sweeping in azimuth, for example, can allow a sensor to detect multiple objects along the same line of sight.

The sensor subsystems 132 or other components of the vehicle 122 can also combine groups of one or more raw sensor measurements from one or more sensors. A group of sensor measurements can be represented in any of a variety of ways, depending on the kinds of sensor measurements that are being captured. Each group of raw laser sensor measurements, for example, can be represented as a three-dimensional point cloud, with each point having an intensity and a position. In some implementations, the position is represented as a range and elevation pair. Each group of camera sensor measurements can be represented as an image patch, e.g., an RGB image patch.

Once a group of one or more raw sensor measurements has been generated, the sensor subsystems 132, or the other components of the vehicle 122, can generate a sensor sample 155 from the raw sensor measurements captured by the vehicle 122 at multiple time steps, i.e., from sensor measurements taken at multiple different time points. The sensor sample 155 can characterize the environment in a vicinity of the vehicle 122 at each of the multiple time steps. For example, the sensor sample can include one or more of: images captured by the camera sensor of the environment at multiple frames, three-dimensional point cloud data generated by one or more of the laser sensors at multiple time steps, or portions of one or more projections, e.g., a projection from a top-down view or a perspective view, of raw sensor measurements captured by one or more of the laser sensors at multiple time steps.

The sensor subsystems 132, or the other components provide the sensor sample 155 to an on-board prediction subsystem 134. The on-board prediction subsystem 134 uses some or all of the data in the sensor sample 155 to generate one or more predictions 165. For example, the on-board prediction subsystem 134 can implement one or more machine learning models that each use the sensor sample 155 to make a prediction that is relevant to the operation of the vehicle 122. As a particular example, one or more machine learning models can be classification machine learning models that classify an object located in the region characterized by the sensor sample. As another particular example, one or more machine learning models can be vehicle trajectory prediction machine learning models that predict a future trajectory of a vehicle located in the region characterized by the sensor sample.

The on-board prediction subsystem 134 can provide the predictions 165 to a planning subsystem 136, a user interface subsystem 138, or both.

When a planning subsystem 136 receives the predictions 165, the planning subsystem 136 can use the predictions 165 to make fully-autonomous or semi-autonomous driving decisions. For example, if the predictions include a prediction indicating that double-parked cars are in the vicinity of the vehicle, the planning subsystem 136 can generate a fully-autonomous plan to adjust the trajectory of the vehicle 122 to avoid the double-parked cars, e.g., to change lane and yield to the double-parked cars. As another example, the planning subsystem 136 can generate a semi-autonomous recommendation for a human driver to apply the brakes in order to avoid collision with the double-parked cars.

A user interface subsystem 138 can receive the predictions 165 and can generate a user interface presentation based on the predictions 165, e.g., an alert for an operator of the vehicle 122 that the a nearby vehicle is planning to cut in front of the vehicle, or a user interface presentation having image or video data containing a representation of the region of space that is occupied by another vehicle. An on-board display device can then display the user interface presentation for view by passengers of the vehicle 122.

The on-board prediction subsystem 134 can also transmit the sensor samples 155 to the training system 110, e.g., for use in training various machine learning models to make predictions. The on-board system 120 can provide the sensor samples 155 to the training system 110 in offline batches, or in an online fashion, e.g., continually whenever the sensor samples are generated.

The training system 110 is typically hosted within a data center 112, which can be a distributed computing system having hundreds or thousands of computers in one or more locations.

When the training system 110 receives sensor samples 155 from a vehicle, the training system 110 stores the sensor samples 155 in a sensor data repository 125. Generally, the sensor data repository 125 stores sensor samples received from a large number of vehicles, i.e., the sensor data repository 125 stores sensor samples generated from sensor data captured during the operation of a large number of different vehicles. In some cases, the sensor data repository 125 can also include sensor samples generated in simulation, i.e., generated as simulated versions of vehicles navigate through a software simulation of a real-world environment.

The training system 110 includes a training subsystem 114 that trains various machine learning models to make predictions using training data generated from the sensor samples in the sensor data repository 125.

For example, the training system 110 can use the sensor samples stored in the sensor data repository 125 to generate training data that includes training examples 123 for training a machine learning model. Each training example 123 includes (i) data from a sensor sample and (ii) a label that indicates some ground truth output that should be generated by the machine learning model for the sensor sample. The training subsystem 114 can then train a machine learning model on the training data to determine trained values of the weights of the machine learning model. After training is complete, the training system 110 can provide a final set of model weight values to the on-board prediction subsystem 134 for use in making predictions 165 for fully autonomous or semi-autonomous driving decisions. The training system 110 can provide the final set of model weight values by a wired or wireless connection to the on-board system 120.

The training system 110 often searches the sensor data repository 125 for relevant sensor samples that can be used as training examples 123. In particular, it may be necessary to search for relevant sensor samples with scenarios of interest that can be used as training examples 123 to train a machine learning model that predicts or identifies certain aspects of the scenarios of interest. Each scenario of interest can involve multiple objects, their interaction with each other, and their interaction with the environment. Each scenario of interest can correspond to sensor measurements over multiple time steps.

For example, the scenarios of interest can include double-parked cars, a group of pedestrians, passengers loading or unloading a vehicle, cars yielding or cutting in front of other cars, and so on. Each scenario of interest can correspond to sensor measurements over multiple frames of camera images, e.g., 15 frames over a period of 5 seconds, or multiple frames of three-dimensional point cloud data captured from lidar sensors.

To allow for searching scenarios of interest from the sensor data repository 125, the training system 110 includes a sensor sample search engine 190. The sensor sample search engine 190 can efficiently search scenarios of interest from the sensor data repository 125 through one or more embedding neural networks 180. The training system 110 implements the one or more embedding neural networks 180, i.e., includes hardware that implements the operations of the layers of the embedding neural networks 180.

In some implementations, the sensor sample search engine 190 can be used for other purposes. For example, the system can generate a visual representation for each of the identified relevant sensor samples and the system can provide the visual representations for presentation on a user device or a display screen in the on-board system 120. Therefore, the system can present the interesting scenes to a user.

Each embedding neural network 180 is a neural network that has been trained to receive as input data from a sensor sample, i.e., a portion of or all of the data in the sensor sample, and to generate as output an embedding of the sensor sample that characterizes a scenario of interest that is measured by the sensor data in the sensor sample.

In some cases, the training system 110 implements a single embedding neural network 180. In other cases, however, the training system 110 implements multiple embedding neural networks 180 that operate on different portions of the sensor sample, that generate embeddings that reflect different characteristics of the sensor sample, or both.

In some implementations, the embedding neural networks 180 may include one or more neural networks that operate on raw sensor data.

For example, the embedding neural networks 180 can include a spatio-temporal embedding (STE) neural network that operates on a temporal sequence, including respective sensor data at multiple time steps. Each sensor data at the corresponding time step includes point cloud data generated from one or more laser sensors, e.g., one or more lidar sensors. The STE neural network can include a spatial embedding neural network and a temporal embedding neural network. The spatial embedding neural network can process each sensor data, e.g., point cloud input, to generate a spatial embedding that characterizes the sensor data. The temporal embedding neural network can process the spatial embeddings of the sensor data to generate a spatio-temporal embedding that characterizes the laser sensor data in the temporal sequence.

In some implementations, the embedding neural networks 180 may include one or more neural networks that generate embeddings by operating on a portion of sensor data near a perception object that has been recognized by a perception system. In other words, these neural networks operate on a portion of the sensor data that has already been classified as characterizing some object in the environment rather than operating on a raw sensor data sample.

For example, the embedding neural networks 180 may include a vehicle intent embedding neural network that operates on sampled frames corresponding to a perception object, e.g., a vehicle, that has been detected in the environment. The sampled frames can include a region corresponding to the perception object, e.g., a region inside a bounding box of the perception object. As a particular example, the embedding neural network 180 can be a portion of a vehicle intent neural network that has been trained to predict vehicle intent, e.g., yielding, cutting in, changing lanes, turning left or right, etc. For example, the embedding neural network 180 can include all but one or more final layers of the trained vehicle intent neural network. Thus, the embeddings generated by this embedding neural network 180 can represent characteristics of the scenarios of vehicle intent depicted in the sensor sample.

When new sensor samples are received, the search engine 190 processes the new sensor samples using the embedding neural networks 180 to generate embeddings of each new sensor sample. The search engine 190 then stores each sensor sample in the repository 125 with the corresponding embeddings of the sensor sample.

When a request to search the repository is received, the sensor sample search engine 190 generates query embeddings of the query sensor sample specified in the request using the embedding neural networks 180. Instead of directly searching the high-dimensional sensor samples, the sensor sample search engine uses the query embeddings to search the embeddings in the repository. The search engine 190 identifies relevant sensor samples that have embeddings that are closest to the query embeddings. The system can use the identified relevant sensor samples in various ways. In some implementations, the training subsystem 114 can use the relevant sensor samples as training examples 123 to train a machine learning model. In some implementations, the system can generate a representation for each of the relevant sensor samples, e.g., a video, or an image of a key frame, and provide the representation for presentation to a user.

Figure 2:
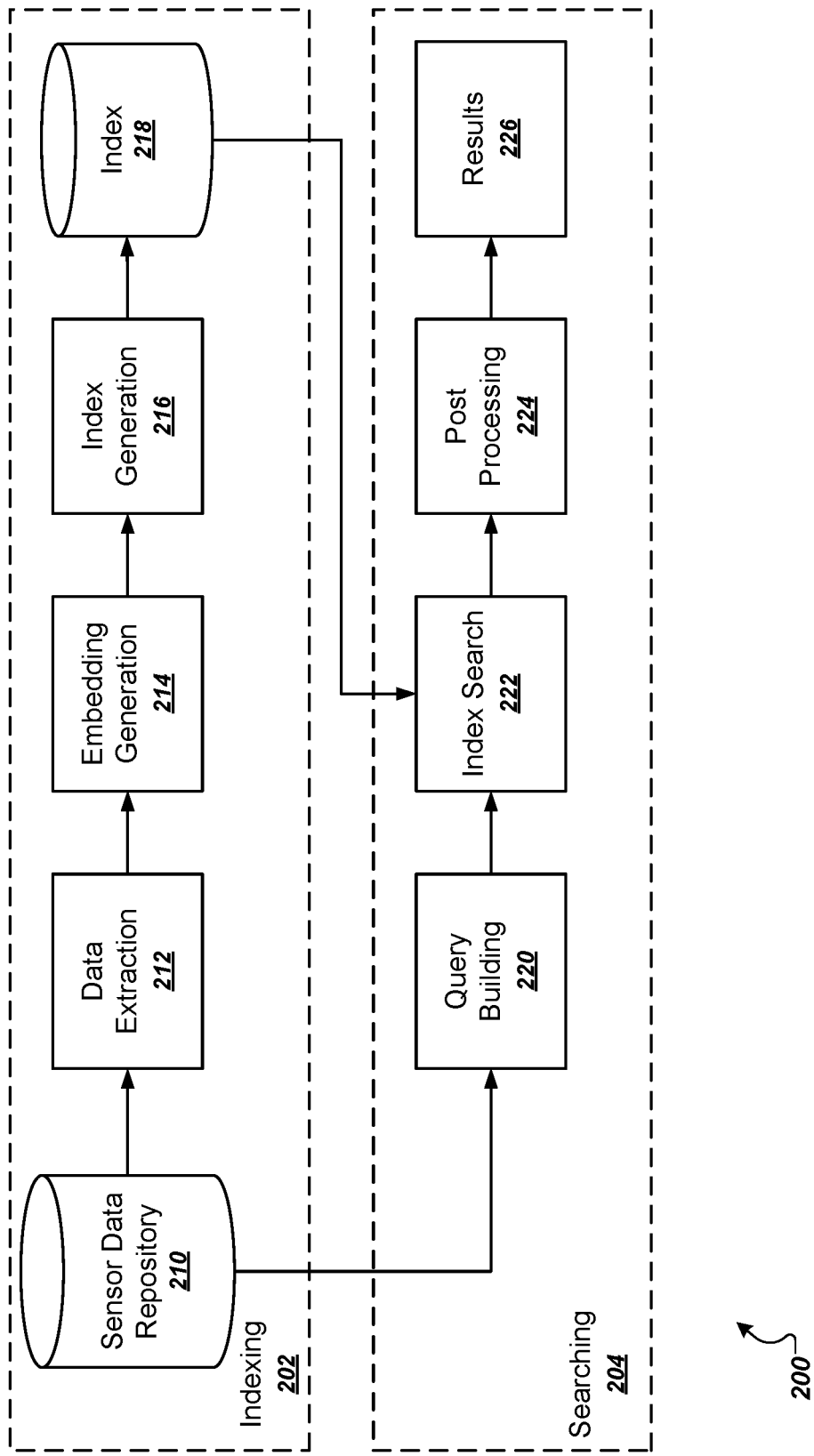
FIG. 2 shows an example process of indexing and searching a sensor data repository.

FIG. 2 shows an example process of indexing and searching a sensor sample repository. The process will be described as being performed by an appropriately programmed computer system. For convenience, the process will be described as being performed by a system of one or more computers located in one or more locations. For example, a training system, e.g., the training system 110 of FIG. 1, appropriately programmed in accordance with this specification, can perform the process 200.

The system maintains a collection of sensor samples in the sensor data repository 210. The sensor samples are generated from sensor data collected during the operation of one or more autonomous vehicles.

For each sample in the sensor data repository 210, the system extracts a portion of the sensor sample in a data extraction step 212.

For example, the portion of the sensor sample can be extracted according to a fixed number of time steps. As another example, the system can process the sensor sample using a perception system to obtain a bounding box of an object detected by the perception system. Then the system can extract a portion of the sensor sample that corresponds to the bounding box.

In the embedding generation step 214, the system processes the extracted portion of the sensor sample using each of the one or more embedding neural networks to generate one or more embeddings of the sensor sample. As described above, when the set of embedding neural networks includes multiple neural networks, the different embeddings can represent different properties or characteristics of the sensor sample.

For example, a vehicle intent neural network can include a vehicle appearance embedding neural network, a trajectory feature embedding neural network, and a context feature embedding neural network. The appearance embeddings of a vehicle can characterize an appearance of the vehicle as sensed by one or more sensors of a particular other vehicle in the environment. The appearance embeddings can include appearance feature maps generated from one or more camera images using a pretrained appearance embedding neural network. The appearance embeddings can include features of information identifying turn signal, heading, one or more tracked objects in the vicinity of the vehicle, object type, etc., of the vehicle. For example, the appearance embeddings can include features extracted from camera images that can indicate whether the left-turn signal light of a vehicle is currently on.

As another example, the embedding generated with a trajectory feature embedding neural network can represent properties of the vehicle's trajectory over a period of time. First, the system can take rendered images as input and outputs a road context feature map for each of the vehicles in the environment. The rendered images can include a sequence of road graphs representing a sequence of history frames of a vehicle and its surrounding vehicles. The rendering position can be fixed at the vehicle's latest location. Next, the system can generate a trajectory feature embedding from the road context feature map. For example, the system can perform the following steps: (i) for a vehicle in the environment, obtaining a position of the vehicle in each of the input rendered images of the environment; (ii) obtaining a plurality of cropped feature vectors which include a respective feature vector for each position of the vehicle by cropping the road context feature map based on each position of the vehicle; (iii) generating a trajectory feature embedding of the vehicle by performing average-pooling operation over the plurality of cropped feature vectors, i.e., temporal average-pooling. The trajectory feature embedding can capture local trajectory features of each vehicle in the environment by extracting a feature patch by the vehicle's position on the road context feature map.

In some implementations, the system can use a spatio-temporal embedding (STE) neural network in the embedding generation step 214. In some implementations, the spatio-temporal neural network includes i) a first neural network that processes each point cloud in the sequence of point clouds to generate a respective spatial embedding of each point cloud in the sequence of point clouds and ii) a second neural network that processes the spatial embeddings of the point clouds in the sequence of point clouds to generate the spatio-temporal embedding of the sequence of point clouds. As a particular example, the first neural network can include a voxel embedding neural network and a spatial embedding neural network. The voxel embedding neural network can divide the environment represented by a point cloud into a voxel grid and generate a respective embedding of each voxel in the voxel grid. The spatial embedding neural network can process the respective embeddings of the voxels in the voxel grid to generate the spatial embedding of the point cloud.

Raw point cloud data is very high-dimensional, and the task of encoding the information of each point cloud in a sequence of point clouds, each of which can contain millions of points, does not lend itself well to conventional recurrent neural networks. Using the spatio-temporal embedding neural network, the system can distill the information contained in a sequence of point clouds that each contain millions of points into a single embedding that captures the rich spatial and temporal features of the environment characterized by the sequence of point clouds.

In some implementations, in the embedding generation step 214, the system generates an embedding for a portion of the sensor sample by cropping a region of interest from full sensor data and running the embedding neural network over the cropped sensor data. For example, the sensor sample can include raw three-dimensional point cloud data of the full 360-degree environment. The system can crop the raw point cloud data according to fixed size regions, e.g., 16 meters by 16 meters regions. The system can take the cropped point cloud data as input to the embedding neural network and can generate an embedding for the cropped point cloud data. In some implementations, when the sample data is captured over multiple time steps, the system can crop the sample data over a few time frames. The time frames are configurable and depend on the input requirements for the embedding neural network model. For example, the system can crop the raw point cloud data over the same fixed size region at a few time stamps. As another example, for each time step, the system can crop the raw point cloud data over different regions that have the fixed size, e.g., according to a region of an object bounding box generated for each time step by a perception system.

In the index generation step 216, the system generates an index that can associate an embedding with data identifying the corresponding portion of the sensor sample. The index can include data identifying the sensor sample from which the portion was extracted and data identifying the location of the portion within the sensor sample.

In some implementations, the data identifying the sensor sample from which the portion was extracted can include a frame index, a run segment index, etc. In some implementations, the data identifying the location of the portion within the sensor sample can include coordinate data or an object ID number.

For example, when the system uses regions of a fixed size to crop the embeddings, the index can include the coordinate of the center of the region, e.g., values of the coordinate (x, y) of the center. As another example, when the system employs vehicle intent embedding, the index can include an identification number of a corresponding vehicle characterized by the vehicle intent embedding, e.g., a vehicle ID number, or a perception object ID number.

In the searching step 204, the system receives a query specifying a portion of a query sensor sample. The query can correspond to a scenario of interest, e.g., double-parked cars, a vehicle that intends to change lane, etc. The query sensor sample can be generated from a recently collected sensor data, or from a portion of a sensor sample that is stored in the sensor data repository 210.

In the query building step 220, the system generates a query embedding of the portion of the query sensor sample. The system uses the same neural networks that were used in embedding generation step 214. For example, the system can use a STE neural network to generate a spatio-temporal embedding of the portion of the query sensor sample, and the same STE neural network can be used in the embedding generation step 214 to process the sensor samples in the sensor data repository.

The system can perform index search 222 to find sensor samples that characterize similar scenarios to the scenario characterized in the portion of the query sensor sample. For example, given a query sensor sample that depicts double-parked cars, the system can search the index of the embeddings of the sensor samples and identify portions of the sensor sample that include double-parked cars.

In some implementations, the system can find relevant sensor samples using the k-nearest neighbor (KNN) search algorithm that identifies top k nearest neighbors to the query (Hwang, Wen-Jyi, and Kuo-Wei Wen. "Fast kNN classification algorithm based on partial distance search." Electronics letters 34.21 (1998): 2062-2063). In some implementations, the system can identify embeddings that are closest to the query embedding according to a distance metric. For example, the distance metric can include Euclidean distance, or cosine similarity, etc.

After identifying the relevant embeddings, the system can efficiently identify the corresponding sensor samples and portions of the sensor samples in the sensor data repository 210 by their index 218. For example, the system can identify the frame of the sensor sample using the frame index information in the index. The system can identify a portion within the sensor sample from which the embedding was generated using the center coordinate included in the index. The system can identify a vehicle of interest in the sensor sample using the vehicle ID number included in the index.

The system can perform a post-processing step 224 to the identified sensor samples. For example, the system can select one or more key frames to represent an identified sensor sample. As another example, the system can crop a portion of the sensor sample from the identified sensor sample.

The system can generate query results 226 from the identified sensor samples. The query results can include links to the identified relevant sensor samples stored in the sensor data repository 210. In some implementations, the system can use the query results 226 to generate training examples 123 that can be used to train a machine learning model. In some implementations, the query results 226 can include a visual representation for each of the identified sensor samples, and the system can provide the visual representations for presentation on a user device.

Figure 3:
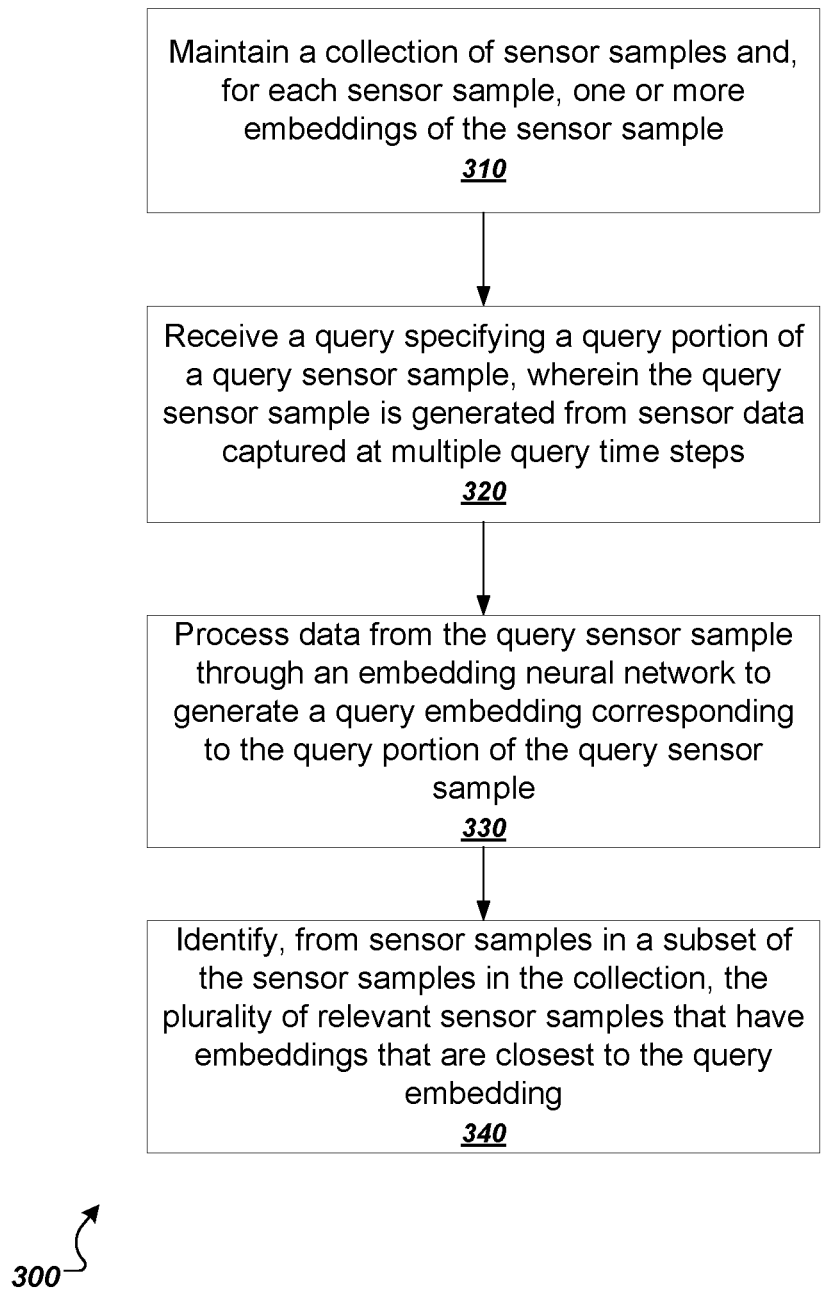
FIG. 3 is a flowchart of an example process for searching the repository based on a context embedding.

FIG. 3 is a flow chart of an example process 300 for searching a repository storing a collection of sensor samples. The process will be described as being performed by an appropriately programmed computer system. For convenience, the process 300 will be described as being performed by a system of one or more computers located in one or more locations. For example, a training system, e.g., the training system 110 of FIG. 1, appropriately programmed in accordance with this specification, can perform the process 300.

The system maintains a collection of sensor samples and, for each sensor sample, one or more embeddings of the sensor sample (310). As described above, the sensor data repository includes a collection of sensor samples. Each sensor sample in the collection is generated from sensor data captured by a corresponding vehicle at multiple time steps. Each sensor sample characterizes an environment in a vicinity of the corresponding vehicle at each of the multiple time steps.

For example, a sensor sample can include multiple frames of laser data captured over a period of time, e.g., five seconds. Each frame of the laser data can include point cloud data generated by one or more of the laser sensors. The point cloud data can be three-dimensional data. The point cloud data can characterize an environment in a vicinity of an autonomous driving vehicle.

As another example, a sensor sample can include multiple frames of images captured by a camera sensor over a period of time, e.g., five seconds. The multiple frames of images can characterize one or more vehicles in a vicinity of an autonomous driving vehicle.

In some implementations, the sensor sample can include a combination of point cloud data and images over the same period of time. In some implementations, the sensor sample can include one or more projections, e.g., a projection from a top-down view or a perspective view, of sensor measurements captured by one or more of the sensors.

As described above, each sensor sample in the repository is also associated with one or more embeddings of the sensor sample. Each embedding corresponds to a respective portion of the sensor sample. Each embedding is generated by processing data from the corresponding sensor sample through an embedding neural network.

In some implementations, the portion of the sensor sample can include a region within the sensor sample. The system can first generate a global embedding of the entire sensor sample by processing the entire data from the sensor sample using the embedding neural network. The system can generate an embedding of the portion of the sensor sample by cropping the global embedding according to location of the region within the sensor sample. The system can store the embedding for each portion of the sensor sample in the sensor data repository. For example, the system can first generate an embedding of the entire three-dimensional point cloud data. Then the system can generate an embedding that corresponds to each region of the point cloud data by cropping the embedding of the entire point cloud data according to the location of the region.

In some implementations, the system can localize a perception object using a perception neural network that processes a sensor sample. The perception object corresponds to a real-world object in the environment. For example, the system can use an object detection neural network to detect another vehicle that is driving near the autonomous vehicle. The system can generate a portion of the sensor sample that includes the perception object. The system can generate an embedding of the portion of the sensor sample by processing the portion of the sensor sample using an embedding neural network.

For example, the perception object can be a car that is in front of the autonomous vehicle. The system can use an object detection system to detect the locations of the car in multiple frames of camera images. In each camera image, the location of the car can include a location of a bounding box surrounding the car of interest. The system can generate a portion of the sensor sample that includes the car of interest. As an example, the system can generate patches of the frames of the camera images around the bounding box of the car. The patches of the frames of the camera images can represent a scenario or behavior of the car over a period of time, e.g., two seconds. The system can generate an embedding of the car of interest by processing the patches of the frames of the camera images using an embedding neural network. e.g., generating a vehicle intent embedding using a vehicle intent embedding neural network.

The embedding neural network can be previously trained to process data from input sensor samples to generate a respective embedding for each input sensor sample. More specifically, each embedding that is generated by a given embedding neural network is generated in accordance with the same, trained parameter values of the embedding neural network. That is, the system or another system trains each embedding neural network and then fixes the parameter values to the trained values.

In some implementations, the system can generate the embedding by processing data from the sensor sample through one or more layers of a spatio-temporal embedding neural network. As discussed above, the spatio-temporal embedding neural network can be configured to generate a spatio-temporal embedding of the sensor sample. The embedding that corresponds to a portion of the sensor sample can be generated by cropping the spatio-temporal embedding of the entire sensor sample according to the portion of the sensor sample.

In some implementations, the system can generate the embedding corresponding to a respective portion of a perception object. The perception object is generated by a perception neural network operating on the sensor sample at multiple time steps. For example, the perception object can be a vehicle in the environment. In some implementations, the system can generate the embedding of the perception object through one or more layers of a vehicle intent neural network. As discussed above, the vehicle intent neural network can be configured to predict an intent of the vehicle corresponding to the perception object.

For example, the system can run the vehicle intent network on sampled frames of the camera images that include a vehicle in front of the autonomous driving vehicle. The system can generate an embedding of the vehicle that corresponds to a particular intent of the vehicle depicted in the sampled frames of the camera images. The particular intent of the vehicle can include turning left, changing lanes, yielding or cutting in front of other cars, etc.

The system receives a query specifying a query portion of a query sensor sample. The query sensor sample is generated from sensor data captured at multiple query time steps (320). In some implementations, the system can receive a user input or other request specifying a region of interest in the environment and can identify or generate a query sensor sample characterizing the region of interest at multiple query time steps.

In some implementations, the system can provide, for presentation in a user interface, an image of the environment surrounding a vehicle as generated by the camera sensor of the vehicle (or a visual representation of other sensor data captured by other sensors) and the user can submit an input specifying the region of the image that is of interest.

For example, the query sensor sample can include point cloud data captured by lidar sensors at multiple time steps. The query can specify a portion of the query sensor sample that characterizes a scenario of interest over a period of time, e.g., a pair of double-parked cars, or a group of pedestrians walking together, etc. For example, the query can include a run segment of the point cloud data, a frame timestamp, and the coordinate of double-parked cars in a scene. Therefore, the query is intended to find portions of sensor samples in the repository that depict similar scenarios.

As another example, the query can specify a vehicle of interest in the environment. The query can specify a segment of the road graph data (i.e., rendered images representing a sequence of history frames of vehicles), time stamp of the frames of interest, and a vehicle of interest. The system can identify a query portion of the road graph data that includes the vehicle of interest in the frames of interest. For example, the query sensor sample can depict a scenario when a vehicle of interest is yielding to another vehicle in the environment. Therefore, the query is intended to find portions of sensor samples in the repository that depict vehicles with a similar intent.

The system identifies, from the collection of sensor samples, a plurality of relevant sensor samples that characterize similar scenarios to the query portion of the query sensor sample. The system processes data from the query sensor sample through the embedding neural network to generate a query embedding corresponding to the query portion of the query sensor sample (330). The system identifies, from sensor samples in a subset of the sensor samples in the collection, the plurality of relevant sensor samples that have embeddings that are closest to the query embedding (340).

In some implementations, embeddings of the sensor samples in the collection and the query embedding can each be generated in accordance with trained values of parameters of the same embedding neural network.

In some implementations, the plurality of relevant sensor samples that have embeddings that are closest to the query embedding can be the sensor samples that are nearest to the query embedding according to a distance metric. For example, the distance metric can be Euclidean distance or cosine similarity.

In some implementations, the system processes data from the query sensor sample through a spatio-temporal embedding neural network to generate a query spatio-temporal embedding corresponding to the query portion of the query sensor sample. The system can identify a region within a sensor sample in the repository that has a similar spatio-temporal embedding to the query region in the query sensor sample.

For example, the system can generate and store a spatio-temporal embedding for each portion of the sensor samples in the sensor sample repository. A query portion of a query sensor sample can depict a scenario of passengers getting on a vehicle. The system can generate a spatio-temporal embedding of the query portion of the query sensor sample. The system can determine a subset of the sensor samples that depict interactive relationships between people and vehicles. The system can identify relevant sensor samples that have spatio-temporal embeddings that are closest to the query spatio-temporal embedding. The identified relevant sensor samples most likely also characterize scenarios of passengers getting on a vehicle.

In some implementations, the query portion of the query sensor sample can include a query perception object corresponding to a query vehicle detected in the query sensor sample. The system can identify a vehicle that has a similar intent to the query vehicle detected in the query sensor sample.

For example, the system can generate and store vehicle intent embeddings for the portions of the sensor samples that include perception objects. A query portion of a query sensor sample can depict a scenario of a vehicle of interest that is cutting in front of another vehicle. The system can generate a vehicle intent embedding of the vehicle of interest in the query sensor sample. The system can determine a subset of the sensor samples that depict vehicles that are changing their lanes or directions. The system can identify relevant sensor samples that have vehicle intent embeddings that are closest to the query vehicle intent embedding. The identified relevant sensor samples most likely also characterize scenarios of a vehicle of interest cutting in front of another vehicle.

After the system identifies the relevant sensor samples, the system can use the relevant sensor samples in a variety of ways.

In some implementations, the system can generate a visual representation for each of the plurality of relevant sensor samples, and the system can provide the visual representation for presentation on a user device.

For example, when the perception object in the sensor data corresponds to a vehicle with a particular intent, the system can generate, for each of the identified sensor samples, a visual representation of the sensor sample within a particular time and provide the visual representation for presentation on a user device. As a particular example, the system can generate, for each relevant sensor sample, a video representation of the relevant sensor sample within a time window, e.g., a video showing the camera image patches from the relevant sensor sample arranged in chronological order.

In some implementations, the system can use the relevant sensor samples to generate training data for a machine learning model.

For example, when the portion of the relevant sensor sample characterizes a particular scenario between multiple objects, the system can use the relevant sensor samples to generate training data for training a machine learning model to classify whether or not an input sensor sample characterizes the particular scenario, and to detect the location of the particular scenario. This can be useful, for example, when it is discovered that the autonomous vehicles would benefit from being able to accurately classify or localize a particular scenario of interest, but an insufficient number of samples are labeled as events belonging to that particular scenario of interest.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, off-the-shelf or custom-made parallel processing subsystems, e.g., a GPU or another kind of special-purpose processing subsystem. The apparatus can also be, or further include, special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program which may also be referred to or described as a program, software, a software application, an app, a module, a software module, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

As used in this specification, an "engine," or "software engine," refers to a software implemented input/output system that provides an output that is different from the input. An engine can be an encoded block of functionality, such as a library, a platform, a software development kit ("SDK"), or an object. Each engine can be implemented on any appropriate type of computing device, e.g., servers, mobile phones, tablet computers, notebook computers, music players, e-book readers, laptop or desktop computers, PDAs, smart phones, or other stationary or portable devices, that includes one or more processors and computer readable media. Additionally, two or more of the engines may be implemented on the same computing device, or on different computing devices.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and pointing device, e.g., a mouse, trackball, or a presence sensitive display or other surface by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone, running a messaging application, and receiving responsive messages from the user in return.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A computer-implemented method, comprising:
    maintaining a collection of sensor samples and, for each sensor sample, one or more embeddings of the sensor sample, wherein:
        each sensor sample in the collection is generated from sensor data captured by a corresponding vehicle at multiple time steps and characterizes an environment in a vicinity of the corresponding vehicle at each of the multiple time steps, and
        each embedding corresponds to a respective portion of the sensor sample at each of the multiple time steps and has been generated by processing the respective portions of the sensor sample at the multiple time steps as an input to an embedding neural network that has been trained to process data from input sensor samples each captured at two or more time steps to generate a respective embedding for each input sensor sample captured at two or more time steps, wherein the respective portion of the sensor sample comprises a perception object that has been recognized in the sensor sample by a perception system;
    receiving a query specifying a query portion of a query sensor sample, wherein the query sensor sample is generated from sensor data captured at multiple query time steps; and
    identifying, from the collection of the sensor samples, a plurality of relevant sensor samples that characterize similar scenarios to the query portion of the query sensor sample, comprising:
        processing data from the query sensor sample at the multiple query time steps through the embedding neural network to generate a query embedding of the query portion of the query sensor sample; and
        identifying, from sensor samples in a subset of the sensor samples in the collection, the plurality of relevant sensor samples that have embeddings that are closest to the query embedding.

2. The method of claim 1, wherein the portion of the sensor sample comprises a region of the perception object within the sensor sample, and the method comprises:
    generating a global embedding of the sensor sample by processing data from the sensor sample; and generating an embedding that corresponds to the portion of the sensor sample by cropping the global embedding according to the region of the perception object within the sensor sample.

3. The method of claim 2, wherein generating the global embedding comprises generating the global embedding from one or more layers of a spatio-temporal embedding neural network, wherein the global embedding comprises a spatio-temporal embedding that represents spatial and temporal features of the environment characterized by the sensor sample.

4. The method of claim 3, wherein the query portion of the query sensor sample comprises a query region in the query sensor sample, and wherein identifying the plurality of relevant sensor samples that characterize similar scenarios to the query portion of the query sensor sample comprises:
identifying a region within each of the plurality of relevant sensor samples that has a similar spatio-temporal embedding to the query region in the query sensor sample.

5. The method of claim 1, wherein the perception object corresponds to a vehicle in the environment, and the embedding of the perception object is generated from one or more layers of a vehicle intent neural network, wherein the embedding of the perception object is used to predict an intent of the vehicle.

6. The method of claim 5, wherein the query portion of the query sensor sample comprises a query perception object corresponding to a query vehicle detected in the query sensor sample, and wherein identifying the plurality of relevant sensor samples that characterize similar scenarios to the query portion of the query sensor sample comprises:
identifying a vehicle within each of the plurality of relevant sensor samples that has a similar intent to the query vehicle detected in the query sensor sample.

7. The method of claim 1, further comprising:
generating a visual representation for each of the plurality of relevant sensor samples; and
providing the visual representations for presentation on a user device.

8. The method of claim 1, further comprising:
using the relevant sensor samples to generate training data for a machine learning model.

9. The method of claim 1, wherein the embeddings of the sensor samples in the collection and the query embedding are each generated in accordance with trained values of parameters of the embedding neural network.

10. The method of claim 1, wherein the plurality of relevant sensor samples that have embeddings that are closest to the query embedding are the sensor samples that are nearest to the query embedding according to a distance metric.

11. The method of claim 10, wherein the distance metric is Euclidean distance or cosine similarity.

12. A system comprising one or more computers and one or more storage devices storing instructions that when executed by the one or more computers cause the one or more computers to perform operations comprising:
maintaining a collection of sensor samples and, for each sensor sample, one or more embeddings of the sensor sample, wherein:
each sensor sample in the collection is generated from sensor data captured by a corresponding vehicle at multiple time steps and characterizes an environment in a vicinity of the corresponding vehicle at each of the multiple time steps, and
each embedding corresponds to a respective portion of the sensor sample at each of the multiple time steps and has been generated by processing the respective portions of the sensor sample at the multiple time steps as an input to an embedding neural network that has been trained to process data from input sensor samples each captured at two or more time steps to generate a respective embedding for each input sensor sample captured at two or more time steps, wherein the respective portion of the sensor sample comprises a perception object that has been recognized in the sensor sample by a perception system;
receiving a query specifying a query portion of a query sensor sample, wherein the query sensor sample is generated from sensor data captured at multiple query time steps; and
identifying, from the collection of the sensor samples, a plurality of relevant sensor samples that characterize similar scenarios to the query portion of the query sensor sample, comprising:
processing data from the query sensor sample at the multiple query time steps through the embedding neural network to generate a query embedding of the query portion of the query sensor sample; and
identifying, from sensor samples in a subset of the sensor samples in the collection, the plurality of relevant sensor samples that have embeddings that are closest to the query embedding.

13. The system of claim 12, wherein the portion of the sensor sample comprises a region of the perception object within the sensor sample, and the operations comprise:
generating a global embedding of the sensor sample by processing data from the sensor sample; and
generating an embedding that corresponds to the portion of the sensor sample by cropping the global embedding according to the region of the perception object within the sensor sample.

14. The system of claim 13, wherein generating the global embedding comprises generating the global embedding from one or more layers of a spatio-temporal embedding neural network, wherein the global embedding comprises a spatio-temporal embedding that represents spatial and temporal features of the environment characterized by the sensor sample.

15. The system of claim 14, wherein the query portion of the query sensor sample comprises a query region in the query sensor sample, and wherein identifying the plurality of relevant sensor samples that characterize similar scenarios to the query portion of the query sensor sample comprises:
identifying a region within each of the plurality of relevant sensor samples that has a similar spatio-temporal embedding to the query region in the query sensor sample.

16. The system of claim 12, wherein the perception object corresponds to a vehicle in the environment, and the embedding of the perception object is generated from one or more layers of a vehicle intent neural network, wherein the embedding of the perception object is used to predict an intent of the vehicle.

17. The system of claim 16, wherein the query portion of the query sensor sample comprises a query perception object corresponding to a query vehicle detected in the query sensor sample, and wherein identifying the plurality of relevant sensor samples that characterize similar scenarios to the query portion of the query sensor sample comprises:

identifying a vehicle within each of the plurality of relevant sensor samples that has a similar intent to the query vehicle detected in the query sensor sample.

18. One or more non-transitory computer-readable storage media storing instructions that when executed by one or more computers cause the one or more computers to perform operations comprising:
    maintaining a collection of sensor samples and, for each sensor sample, one or more embeddings of the sensor sample, wherein:
        each sensor sample in the collection is generated from sensor data captured by a corresponding vehicle at multiple time steps and characterizes an environment in a vicinity of the corresponding vehicle at each of the multiple time steps, and
        each embedding corresponds to a respective portion of the sensor sample at each of the multiple time steps and has been generated by processing the respective portions of the sensor sample at the multiple time steps as an input to an embedding neural network that has been trained to process data from input sensor samples each captured at two or more time steps to generate a respective embedding for each input sensor sample captured at two or more time steps, wherein the respective portion of the sensor sample comprises a perception object that has been recognized in the sensor sample by a perception system;
    receiving a query specifying a query portion of a query sensor sample, wherein the query sensor sample is generated from sensor data captured at multiple query time steps; and
    identifying, from the collection of the sensor samples, a plurality of relevant sensor samples that characterize similar scenarios to the query portion of the query sensor sample, comprising:
        processing data from the query sensor sample at the multiple query time steps through the embedding neural network to generate a query embedding of the query portion of the query sensor sample; and
        identifying, from sensor samples in a subset of the sensor samples in the collection, the plurality of relevant sensor samples that have embeddings that are closest to the query embedding.

19. The method of claim 1, wherein the query portion of the query sensor sample comprises a query perception object that has been recognized in the query sensor sample by a second perception system.

20. The system of claim 12, wherein the query portion of the query sensor sample comprises a query perception object that has been recognized in the query sensor sample by a second perception system.

* * * * *